(12) United States Patent
Ha et al.

(10) Patent No.: US 7,871,890 B2
(45) Date of Patent: Jan. 18, 2011

(54) METHODS OF FABRICATING SEMICONDUCTOR DEVICES HAVING RESISTORS

(75) Inventors: Dae-Won Ha, Seoul (KR); Sang-Yoon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/248,470

(22) Filed: Oct. 9, 2008

(65) Prior Publication Data
US 2009/0098703 A1 Apr. 16, 2009

(30) Foreign Application Priority Data
Oct. 10, 2007 (KR) ..................... 10-2007-0102007

(51) Int. Cl.
*H01L 21/20* (2006.01)
(52) U.S. Cl. ................ 438/385; 438/238; 438/383; 438/384; 257/350; 257/363; 257/E21.004
(58) Field of Classification Search ......... 438/382–385, 438/238; 257/E21.004, 350, 363
See application file for complete search history.

(56) References Cited

U.S. PATENT DOCUMENTS

| | | | |
|---|---|---|---|
| 5,340,754 A * | 8/1994 | Witek et al. .................. | 438/156 |
| 6,172,389 B1 | 1/2001 | Sakoh | |
| 2001/0034106 A1* | 10/2001 | Moise et al. ................. | 438/396 |
| 2002/0031916 A1* | 3/2002 | Ohkubo et al. .............. | 438/758 |
| 2002/0177292 A1 | 11/2002 | Dennison | |
| 2006/0186483 A1* | 8/2006 | Cho et al. .................... | 257/390 |
| 2006/0237756 A1 | 10/2006 | Park et al. | |
| 2006/0284237 A1* | 12/2006 | Park et al. ................... | 257/314 |

FOREIGN PATENT DOCUMENTS

| | | |
|---|---|---|
| JP | 11-289064 | 10/1999 |
| KR | 10-0292594 A | 11/1999 |
| KR | 10-0675279 A | 10/2006 |

OTHER PUBLICATIONS

Bakker A and Huijsing H. Micropower CMOS temperature sensor with digital output. IEEE Journal of Solid-State Circuits. Jul. 7, 1996; 31(7): 933-937.
Bamba H et al. A CMOS band-gap reference circuit with sub 1V operation. 1998 Symposium on VLSI Circuits Digest of Technical Papers. 1998: 228-229.
Xu W et al. A high performance CMOS band-gap reference circuit design. IEEE Int. Workshop VLSI Design & Video Tech. Suzhou, China. May 28-30, 2005: 32-35.

* cited by examiner

*Primary Examiner*—Thanh V Pham
*Assistant Examiner*—Maria Ligai
(74) *Attorney, Agent, or Firm*—Myers Bigel Sibley & Sajovec, P.A.

(57) ABSTRACT

A semiconductor device having a resistor and a method of fabricating the same are provided. The semiconductor device includes a semiconductor substrate having a first circuit region and a second circuit region. A lower interlayer insulating layer is provided over the semiconductor substrate. A first hole passing through the lower interlayer insulating layer in the first circuit region and a second hole passing through the lower interlayer insulating layer in the second circuit region are provided. A first semiconductor pattern and a second semiconductor pattern are sequentially stacked in the first hole. A first resistor having the same crystalline structure as the second semiconductor pattern is provided in the second hole.

6 Claims, 7 Drawing Sheets

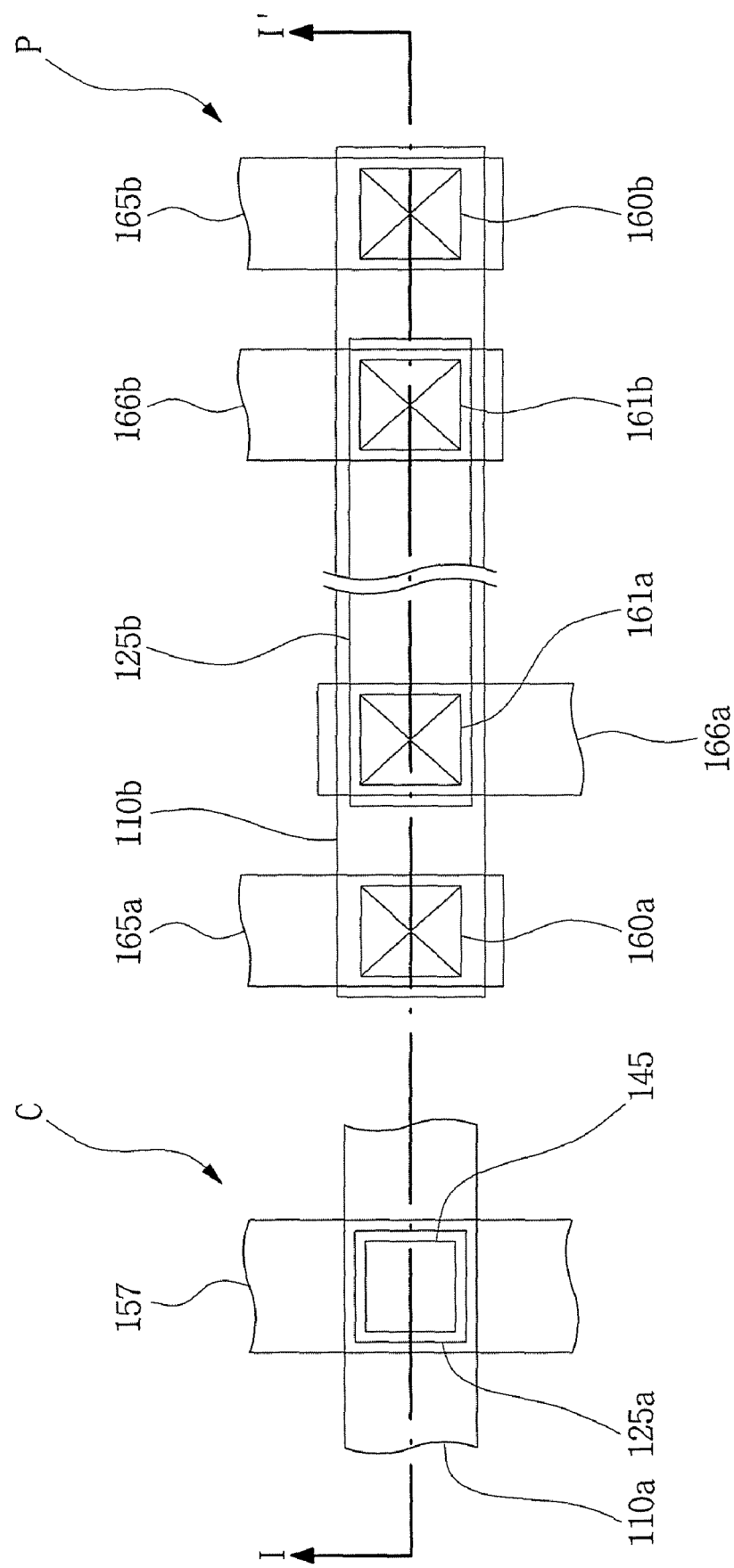

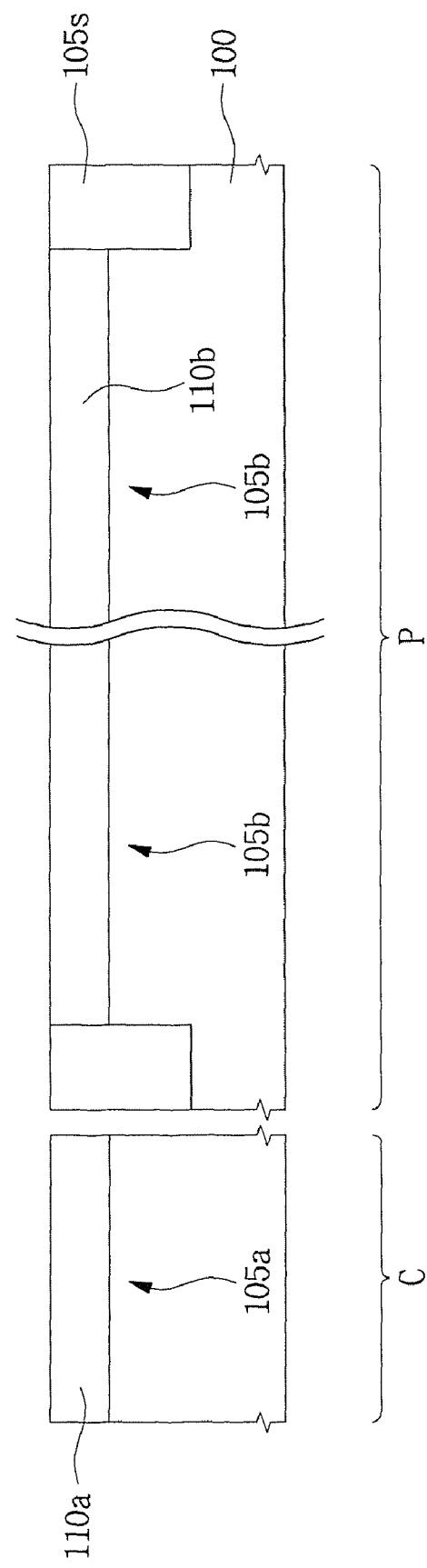

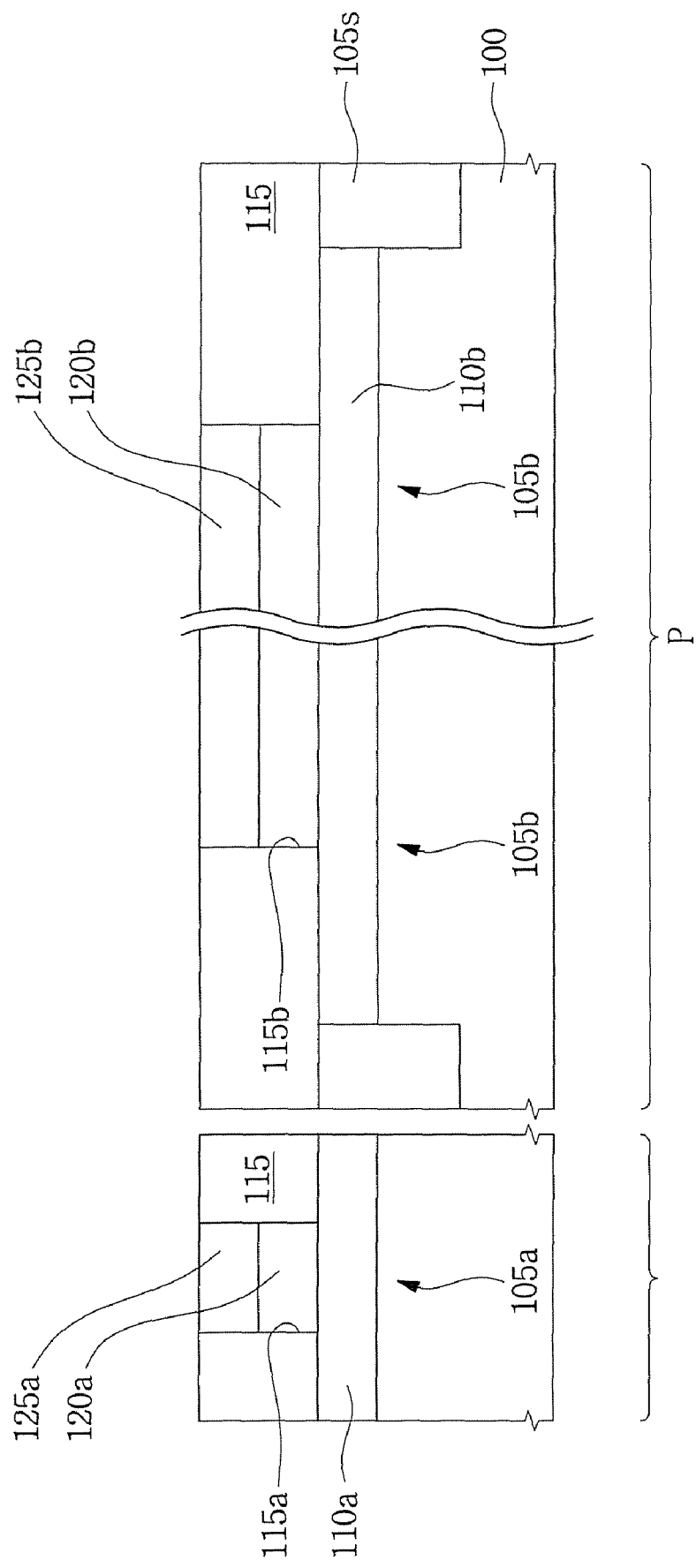

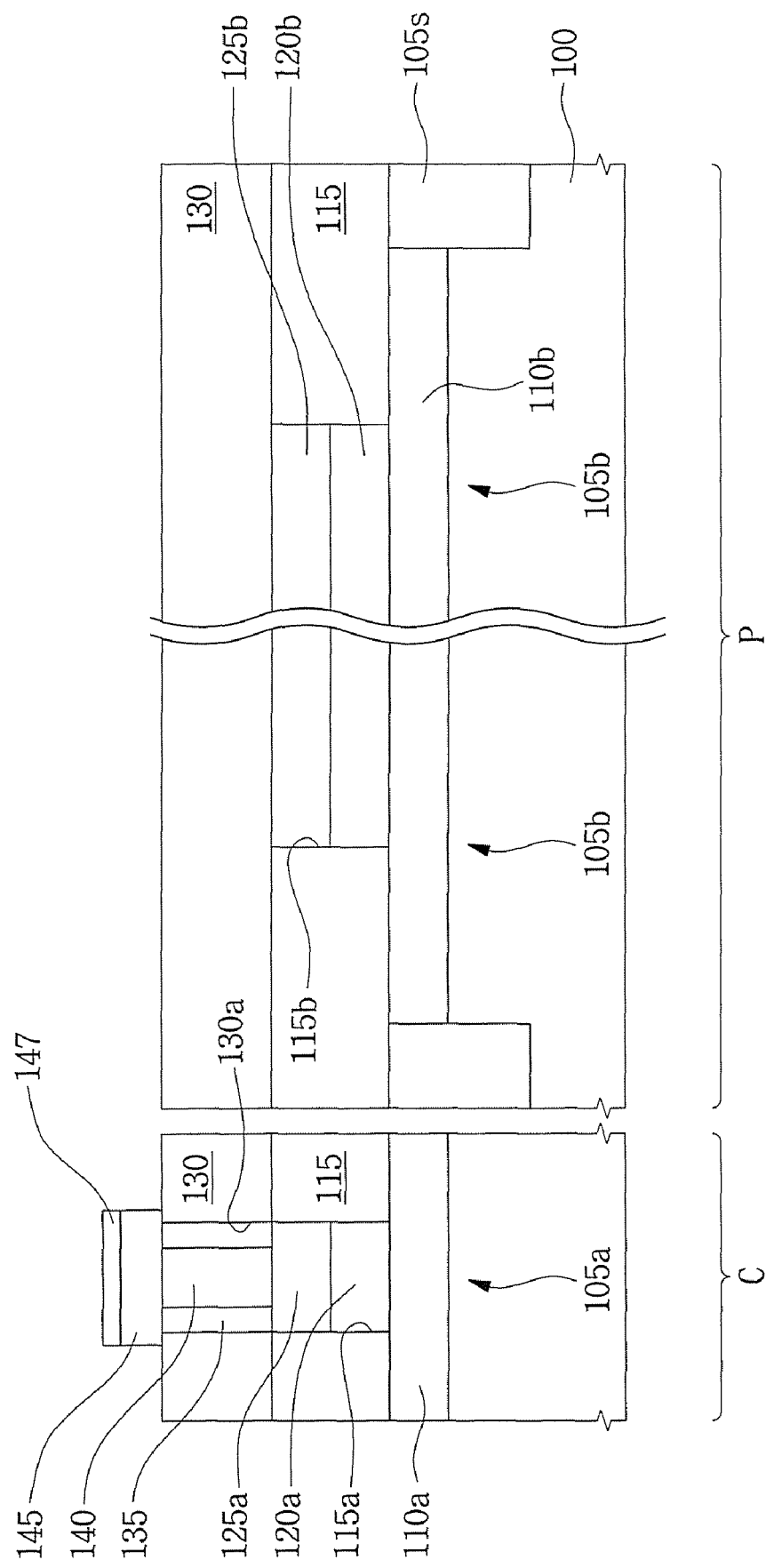

METHODS OF FABRICATING SEMICONDUCTOR DEVICES HAVING RESISTORS

CROSS-REFERENCE TO RELATED APPLICATION

This application claims the benefit of Korean Patent Application No. 10-2007-0102007, filed on Oct. 10, 2007, the disclosure of which is hereby incorporated herein by reference in its entirety.

FIELD OF THE INVENTION

The present invention relates to semiconductor devices and methods of fabricating the same, and more particularly, to semiconductor devices having resistors and methods of fabricating the same.

BACKGROUND

Generally, a semiconductor memory device includes a cell array region constituted by a plurality of unit cells, and a peripheral region disposed outside the cell array region to drive and control the unit cells. Several devices such as a transistor, a diode and a resistor are formed in the peripheral region to drive the unit cells.

SUMMARY OF THE INVENTION

According to one aspect of the present invention, a semiconductor device having a resistor includes: a semiconductor substrate having a first circuit region and a second circuit region; a lower interlayer insulating layer over the semiconductor substrate; a first hole passing through the lower interlayer insulating layer in the first circuit region, and a second hole passing through the lower interlayer insulating layer in the second circuit region; a first semiconductor pattern and a second semiconductor pattern, which are sequentially stacked in the first hole; and a first resistor provided in the second hole and having the same crystalline structure as the second semiconductor pattern.

In some embodiments, the first and second semiconductor patterns may be single crystalline semiconductor patterns.

In another embodiment, the first resistor may have a top surface positioned at the same level as that of the second semiconductor pattern.

In still another embodiment, a word line may be disposed between the lower interlayer insulating layer and the semiconductor substrate in the first circuit region, and have a different conductivity type from the semiconductor substrate in the first circuit region and a separation layer may cover a sidewall of the word line. Here, the first hole may expose a predetermined region of the word line.

The first semiconductor pattern may have the same conductivity type as the word line and a lower impurity concentration than the word line, and the second semiconductor pattern may have a different conductivity type from the word line. Alternatively, the first semiconductor pattern may have the same conductivity type as the second semiconductor pattern, a lower impurity concentration than the second semiconductor pattern, and a different conductivity type from the word line.

In yet another embodiment, a second resistor may be disposed between the lower interlayer insulating layer and the semiconductor substrate in the second circuit region, and have a different conductivity type from the semiconductor substrate in the second circuit region; and a separation layer may cover a sidewall of the second resistor. Here, the second hole may expose a predetermined region of the second resistor.

Furthermore, a barrier impurity region may be interposed between the first resistor and the second resistor.

Meanwhile, the first and second resistors may have different conductivity types from each other, and the barrier impurity region may have the same conductivity type as the first resistor and a lower impurity concentration than the first resistor. Alternatively, the first and second resistors may have different conductivity types from each other, and the barrier impurity region may have the same conductivity type as the second resistor and a lower impurity concentration than the second resistor. Alternatively, the first and second resistors may have the same conductivity type, and the barrier impurity region may have a different conductivity type from the first and second resistors.

Furthermore, the semiconductor device may further include an upper interlayer insulating layer disposed over the lower interlayer insulating layer; a first lower resistor contact plug electrically connected with one end of the second resistor and a second lower resistor contact plug electrically connected with the other end of the second resistor, which pass through the upper interlayer insulating layer and the lower interlayer insulating layer in the second circuit region; a first upper resistor contact plug electrically connected with one end of the second resistor and a second upper resistor contact plug electrically connected with the other end of the second resistor, which pass through the upper interlayer insulating layer in the second circuit region; a first lower resistor interconnection covering the first lower resistor contact plug and a second lower resistor interconnection covering the second lower resistor contact plug, which are provided on the upper interlayer insulating layer in the second circuit region; and a first upper resistor interconnection covering the first upper resistor contact plug and a second upper resistor interconnection covering the second upper resistor contact plug, which are provided on the upper interlayer insulating layer in the second circuit region. Alternatively, the semiconductor device may further include an upper interlayer insulating layer disposed over the lower interlayer insulating layer; a first lower resistor contact plug electrically connected with one end of the second resistor and a second lower resistor contact plug electrically connected with the other end of the second resistor, which pass through the upper interlayer insulating layer and the lower interlayer insulating layer in the second circuit region; a first upper resistor contact plug electrically connected with one end of the second resistor and a second upper resistor contact plug electrically connected with the other end of the second resistor, which pass through the upper interlayer insulating layer in the second circuit region; a first lower resistor interconnection covering the first lower resistor contact plug and a first upper resistor interconnection covering the first upper resistor contact plug, which are provided on the upper interlayer insulating layer in the second circuit region; and a resistor connecting pattern provided on the upper interlayer insulating layer in the second circuit region and in contact with the second lower resistor contact plug and the second upper resistor contact plug.

According to another aspect of the present invention, a method of fabricating a semiconductor device includes: preparing a semiconductor substrate having a first circuit region and a second circuit region; forming a lower interlayer insulating layer on the semiconductor substrate having the first and second circuit regions; patterning the lower interlayer insulating layer to form a first hole passing through the lower interlayer insulating layer in the first circuit region and a second hole passing through the lower interlayer insulating layer in the second circuit region; forming a first semiconductor pattern and a second semiconductor pattern, which are sequentially stacked in the first hole; and forming a barrier impurity region and a first resistor, which are sequentially stacked in the second hole.

In some embodiments, the first and second semiconductor patterns, the barrier impurity region and the first resistor may be formed to have the same crystalline structure.

In another embodiment, the first and second semiconductor patterns, the barrier impurity region and the first resistor may be single crystalline semiconductor patterns.

In still another embodiment, before forming the lower interlayer insulating layer, the method of fabricating the semiconductor device may further include: forming a separation layer in the semiconductor substrate to define a first active region in the first circuit region and a second active region in the second circuit region; injecting impurity ions having a different conductivity type from the semiconductor substrate in the first circuit region into the first active region to form a word line; and injecting impurity ions having a different conductivity type from the semiconductor substrate in the second circuit region into the second active region to form a second resistor. Here, the separation layer may be formed to cover a sidewall of the word line and a sidewall of the second resistor, the first hole may be formed to expose a predetermined region of the word line, and the second hole may be formed to expose a predetermined region of the second resistor.

Furthermore, the method of fabricating the semiconductor device may further include: forming an upper interlayer insulating layer over the semiconductor substrate having the first resistor and the second semiconductor pattern; forming a first lower resistor contact plug electrically connected with one end of the second resistor and a second lower resistor contact plug electrically connected with the other end of the second resistor, which pass through the upper and lower interlayer insulating layers in the second circuit region; forming a first upper resistor contact plug electrically connected with one end of the first resistor and a second upper resistor contact plug electrically connected with the other end of the first resistor, which pass through the upper interlayer insulating layer in the second circuit region; forming a first lower resistor interconnection covering the first lower resistor contact plug and a second lower resistor interconnection covering the second lower resistor contact plug, which are formed on the upper interlayer insulating layer in the second circuit region; and forming a first upper resistor interconnection covering the first upper resistor contact plug and a second upper resistor interconnection covering the second upper resistor contact plug, which are formed on the upper interlayer insulating layer in the second circuit region. Alternatively, the method of fabricating the semiconductor device may further include: forming an upper interlayer insulating layer over the semiconductor substrate having the first resistor and the second semiconductor pattern; forming a first lower resistor contact plug electrically connected with one end of the second resistor and a second lower resistor contact plug electrically connected with the other end of the second resistor, which pass through the upper and lower interlayer insulating layers in the second circuit region; forming a first upper resistor contact plug electrically connected with one end of the first resistor and a second upper resistor contact plug electrically connected with the other end of the first resistor, which pass through the upper interlayer insulating layer in the second circuit region; forming a first lower resistor interconnection covering the first lower resistor contact plug and a first upper resistor interconnection covering the first upper resistor contact plug, which are formed on the upper interlayer insulating layer in the second circuit region; and forming a resistor connecting pattern in contact with the second lower resistor contact plug and the second upper resistor contact plug on the upper interlayer insulating layer in the second circuit region.

In yet another embodiment, forming the first and second semiconductor patterns, the barrier impurity region and the first resistor may include: forming a cell semiconductor pattern in the first hole, and a peripheral semiconductor pattern in the second hole; doping a lower region of the cell semiconductor pattern with impurities having a first conductivity type or a second conductivity type different from the first conductivity type using an ion injection technique; doping an upper region of the cell semiconductor pattern with impurities having the first conductivity type using the ion injection technique; doping a lower region of the peripheral semiconductor pattern with impurities having the first conductivity type or the second conductivity type using the ion injection technique; and doping an upper region of the peripheral semiconductor pattern with impurities having the first conductivity type or the second conductivity type using the ion injection technique.

BRIEF DESCRIPTION OF THE DRAWINGS

FIG. 1 is a plan view of a semiconductor device according to an exemplary embodiment of the present invention;

FIGS. 2A to 2E are cross-sectional views of the semiconductor device according to the exemplary embodiment of the present invention.

DETAILED DESCRIPTION OF EMBODIMENTS OF THE INVENTION

Figure 2B:
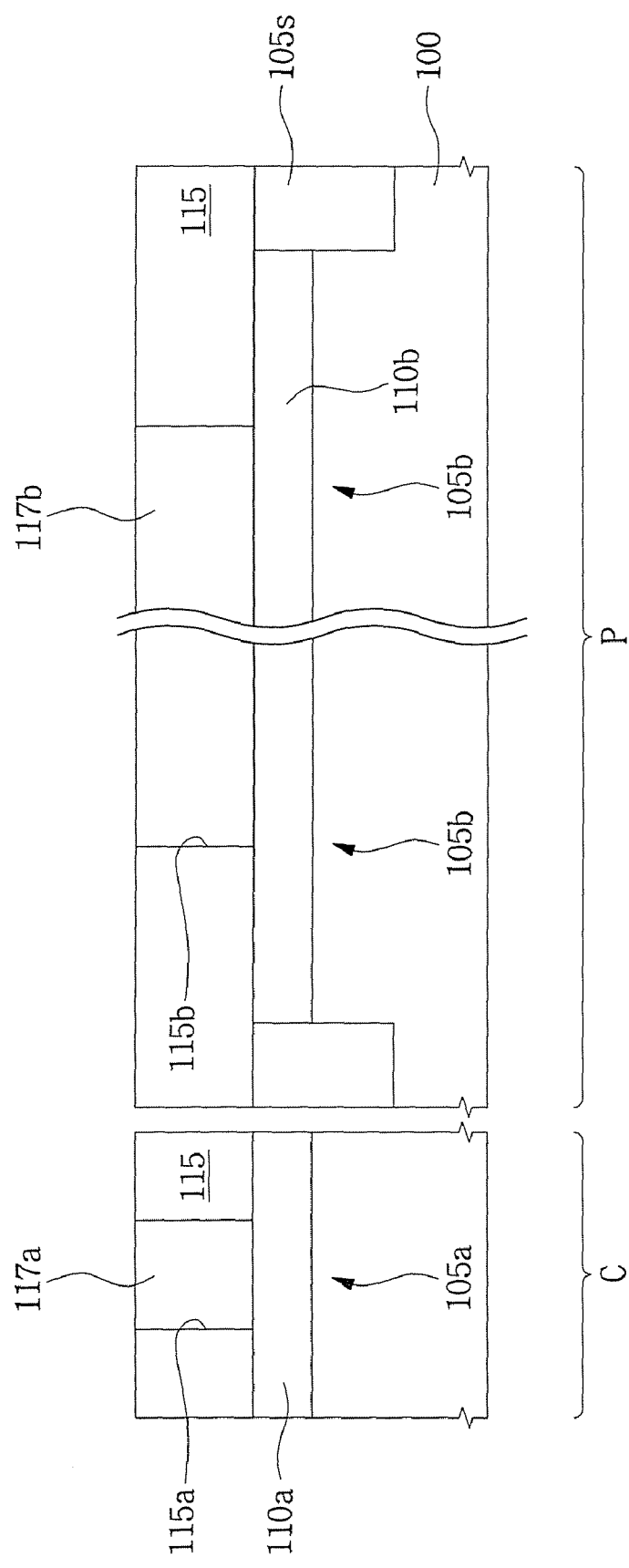

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Figure 2E:
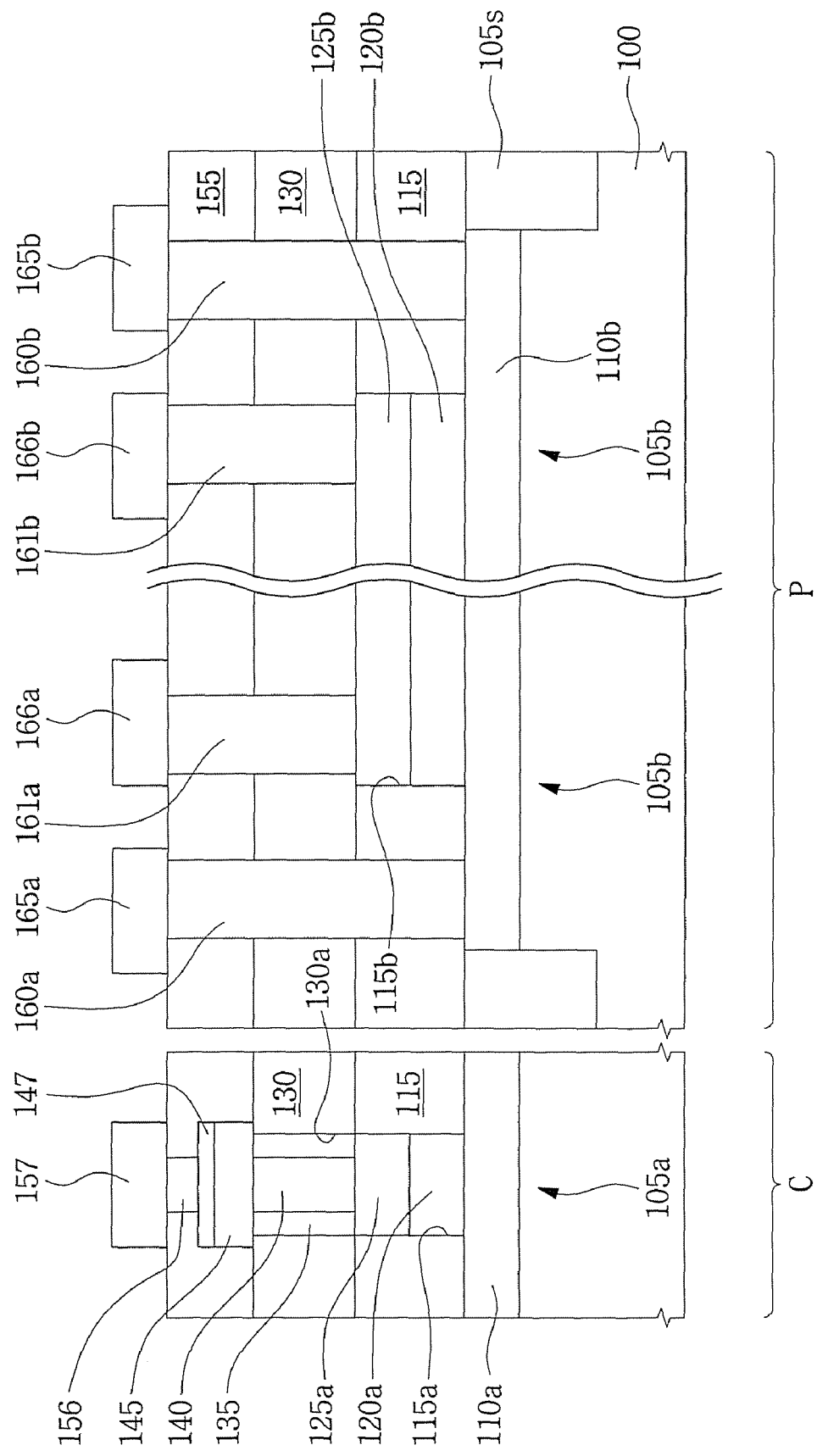
Figure 3:
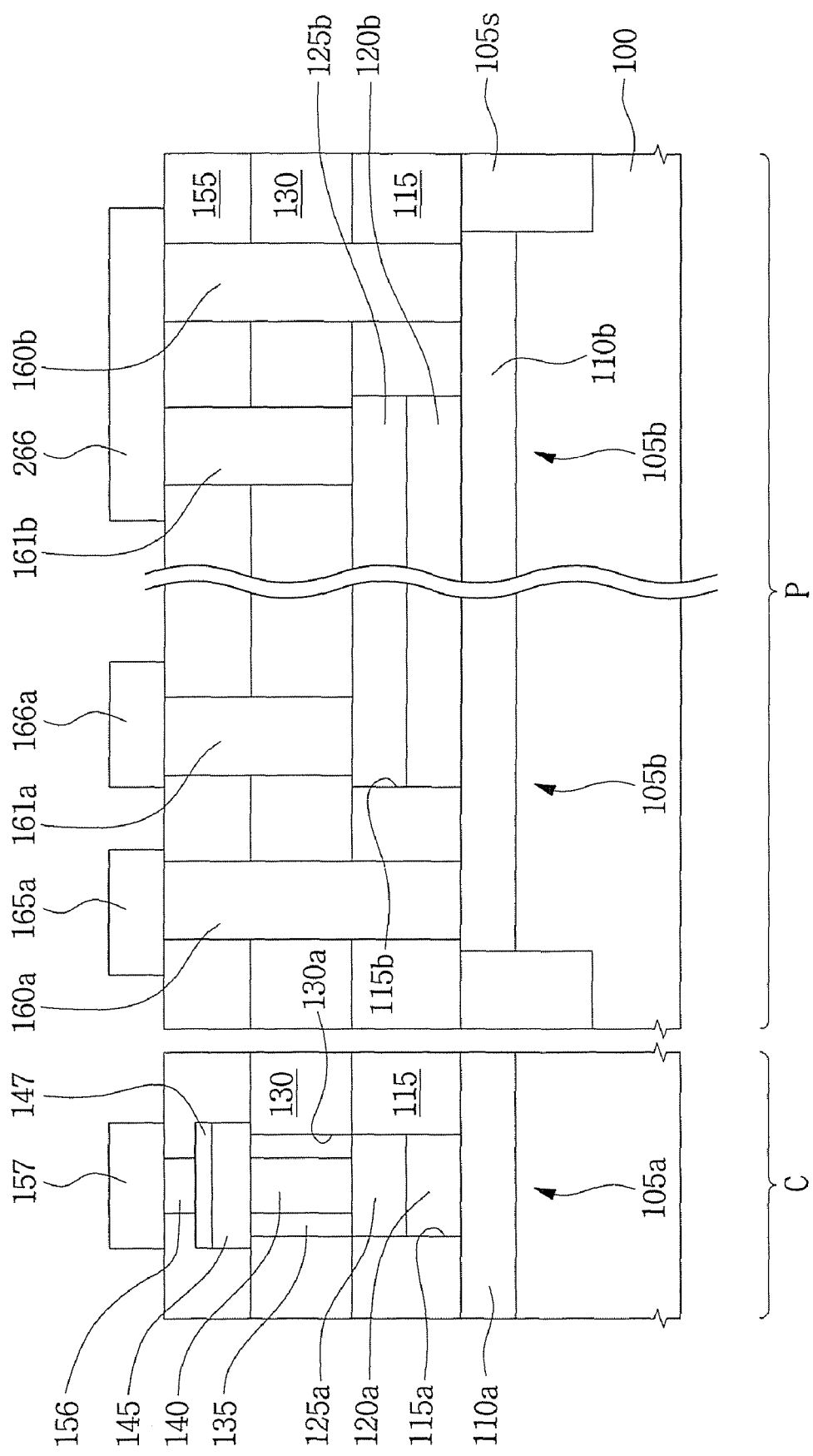
FIG. 3 is a cross-sectional view of a semiconductor device according to another exemplary embodiment of the present invention.

FIG. 1 is a plan view of a semiconductor device according to an exemplary embodiment of the present invention, FIGS. 2A to 2E are cross-sectional views taken along line I-I' of FIG. 1 to explain the semiconductor device according to the exemplary embodiment of the present invention, and FIG. 3 is a cross-sectional view of a semiconductor device according to another exemplary embodiment of the present invention. In FIGS. 1, 2A to 2E and 3, "C" denotes a first circuit region, and "P" denotes a second circuit region.

First, a semiconductor device according to an exemplary embodiment of the present invention will be described with reference to FIGS. 1 and 2E.

Referring to FIGS. 1 and 2E, a semiconductor substrate 100 having a first circuit region C and a second circuit region P is provided. The first circuit region C may be a memory cell array region, and the second circuit region P may be a peripheral circuit region. Meanwhile, the first circuit region C may be an active circuit region, and the second circuit region P may be a passive circuit region. The semiconductor substrate 100 may be a single crystalline silicon substrate. Further, the semiconductor substrate 100 may include materials such as silicon carbide (SiC), silicon germanium (SiGe) and gallium arsenic (GaAs).

A separation layer 105s may be provided in the semiconductor substrate 100 to define a first active region 105a and a second active region 105b. The first active region 105a may be defined in the first circuit region C, and the second active region 105b may be defined in the second circuit region P. A word line 110a having a different conductivity type from the semiconductor substrate 100 in the first circuit region C may be provided in the first active region 105a. Further, a lower resistor 110b having a different conductivity type from the semiconductor substrate 100 in the second circuit region P may be provided in the second active region 105b. The word line 110a and the lower resistor 110b may have a single crystalline semiconductor structure.

Bottom surfaces of the word line 110a and the lower resistor 110b may be positioned at a higher level than that of the separation layer 105s. The separation layer 105s in the first circuit region C may cover a sidewall of the word line 110a. In the same manner, the separation layer 105s in the second circuit region P may cover a sidewall of the lower resistor 110b. Accordingly, the separation layer 105s in the first circuit region C may electrically insulate the word line 110a from another word line adjacent thereto. Similarly, the separation layer 105s in the second circuit region P may electrically insulate the lower resistor 110b from another lower resistor adjacent thereto.

A lower interlayer insulating layer 115 may be provided to cover the separation layer 105s, the word line 110a and the lower resistor 105b. A cell diode hole or opening 115a may be provided to pass through the lower interlayer insulating layer 115 in the first circuit region C and expose a predetermined region of the word line 110a. A peripheral resistance hole or opening 115b may be provided to pass through the lower interlayer insulating layer 115 in the second circuit region P and expose a predetermined region of the lower resistor 110b.

A first semiconductor pattern 120a and a second semiconductor pattern 125a may be sequentially stacked in the cell diode hole 115a. The first and second semiconductor patterns 120a and 125a may be single crystalline semiconductor patterns. For example, the first and second semiconductor patterns 120a and 125b may be single crystalline silicon patterns.

The second semiconductor pattern 125a and the word line 110a have different conductivity types from each other, and the first semiconductor pattern 120a and the word line 110a may have the same conductivity type as each other. For example, when the semiconductor substrate 100 in the first circuit region C is p-type and the word line 110a is n-type, the first semiconductor pattern 120a may be n-type, and the second semiconductor pattern 125a may be p-type. Thus, the first and second semiconductor patterns 120a and 125a sequentially stacked in the cell diode hole 115a may constitute a cell diode. Here, the first semiconductor pattern 120a may have a lower impurity concentration than the word line 110a. This is because when a reverse bias is applied to the cell diode, leakage current flowing through the cell diode can be minimized. On the other hand, the second semiconductor pattern 125a and the word line 110a may have different conductivity types from each other, and the first and second semiconductor patterns 120a and the 125a may have the same conductivity type as each other. For example, when the semiconductor substrate 100 in the first circuit region C is p-type and the word line 110a is n-type, the first and second semiconductor patterns 120a and 125a may be p-type. Thus, the word line 110a and the first semiconductor pattern 120a in contact with the word line 110a may constitute a cell diode. Here, the first semiconductor pattern 120a may have a lower impurity concentration than the second semiconductor pattern 125a. This is because when a reverse bias is applied to the cell diode, leakage current flowing through the cell diode may be minimized.

An upper resistor 125b may be formed in the peripheral resistance hole 115b. The upper resistor 125b may have substantially the same crystalline structure as the second semiconductor pattern 125a. For example, both the upper resistor 125b and the second semiconductor pattern 125a may have a single crystalline semiconductor structure. The upper resistor 125b may have a top surface positioned at substantially the same level as that of the second semiconductor pattern 125a. The upper resistor 125b may be positioned at substantially the same level as the second semiconductor pattern 125a. A barrier impurity region 120b may be formed between the upper resistor 125b and the lower resistor 110b. The barrier impurity region 120b may be provided in the peripheral resistance hole 115b, and positioned at substantially the same level as the first semiconductor pattern 120a. The barrier impurity region 120b and the upper resistor 125b may be single crystalline semiconductor patterns. For example, the barrier impurity region 120b and the upper resistor 125b may be single crystalline silicon patterns. In the present invention, the upper resistor 125b may be represented as a first resistor, and the lower resistor 110b may be represented as a second resistor.

In the present embodiment, the upper resistor 125b and the lower resistor 110b may have different conductivity types from each other. The barrier impurity region 120b may have the same conductivity type as the lower resistor 110b, and may have a lower impurity concentration than the lower resistor 110b. For example, when the semiconductor substrate 100 in the second circuit region P is p-type, the lower resistor 110b may be an n-type semiconductor pattern, the barrier impurity region 120b may be an n-type semiconductor pattern with a lower impurity concentration than the lower resistor 110b, and the upper resistor 125b may be a p-type semiconductor pattern.

In another embodiment, the upper resistor 125b and the lower resistor 110b may have different conductivity types from each other. Further, the barrier impurity region 120b may have the same conductivity type as the upper resistor 125b, and may have a lower impurity concentration than the upper resistor 125b. For example, when the semiconductor substrate 100 in the second circuit region P is p-type, the lower resistor 110b may be an n-type semiconductor pattern, the barrier impurity region 120b may be a p-type semiconductor pattern having a lower impurity concentration than the upper resistor 125b, and the upper resistor 125b may be a p-type semiconductor pattern.

In still another exemplary embodiment, the upper resistor 125b and the lower resistor 110b may have the same conductivity type. Further, the barrier impurity region 120b may have a different conductivity type from the lower and upper resistors 110b and 125b. For example, when the semiconductor substrate 100 in the second circuit region P is p-type, the lower resistor 110b and the upper resistor 125b may be n-type semiconductor patterns, and the barrier impurity region 120b may be a p-type semiconductor pattern.

A middle interlayer insulating layer 130 may be provided on the lower interlayer insulating layer 115 and cover the second semiconductor pattern 125a and the upper resistor 125b. A contact hole 130a may be provided to pass through the middle interlayer insulating layer 130 in the first circuit region C and expose the second semiconductor pattern 125a. A lower electrode 140 having a smaller width than the second semiconductor pattern 125a may be provided in the contact hole 130a. The lower electrode 140 may be a titanium nitride layer or a titanium-aluminum nitride layer. An insulating spacer 135 may be interposed between a sidewall of the contact hole 130 and the lower electrode 140. Meanwhile, while not illustrated in the drawing, a metal silicide layer may be interposed between the lower electrode 140 and the second semiconductor pattern 125a.

An information storage element 145 and an upper electrode 147 may be provided on the lower electrode 140. The information storage element 145 may be a phase change material layer such as a chalcogenide layer. However, the information storage element 145 is not limited to the phase change material layer. For example, the information storage element 145 may be a binary metal oxide layer. The upper electrode 147 may be a titanium nitride layer or a titanium-aluminum nitride layer, which does not react with the information storage element 145.

In yet another embodiment, the lower electrode 140 may partially fill the contact hole 130a, and the information storage element 145 may fill the rest of the contact hole 130a.

An upper interlayer insulating layer 155 may be provided on the middle interlayer insulating layer 130 and cover the information storage element 145 and the upper electrode 147. A bit line contact plug 156 may be provided to pass through the upper interlayer insulating layer 155 in the first circuit region C and be electrically connected with the upper electrode 147. A bit line 157 may be provided on the upper interlayer insulating layer 155 in the first circuit region C and cover the bit line contact plug 156.

In the second circuit region P, a first lower resistor contact plug 160a and a second lower resistor contact plug 160b may be provided to sequentially pass through the upper, middle and lower interlayer insulating layers 155, 130 and 115. The first lower resistor contact plug 160a may be electrically connected with one end of the lower resistor 110b, and the second lower resistor contact plug 160b may be electrically connected with the other end of the lower resistor 110b. In the second circuit region P, a first upper resistor contact plug 161a and a second upper resistor contact plug 161b may be formed to sequentially pass through the upper and middle interlayer insulating layers 155 and 130. The first upper resistor contact plug 161a may be electrically connected with one end of the upper resistor 110a, and the second upper resistor contact plug 161b may be electrically connected with the other end of the lower resistor 110b.

A first lower resistor interconnection 165a covering the first lower resistor contact plug 160a, a second lower resistor interconnection 165b covering the lower resistor contact plug 160b, a first upper resistor interconnection 166a covering the first upper resistor contact plug 161a and a second upper resistor interconnection 166b covering the second upper resistor contact plug 161b may be provided on the upper interlayer insulating layer 155 in the second circuit region P.

The first lower resistor interconnection 165a, the second lower resistor interconnection 165b, the first upper resistor interconnection 166a and the second upper resistor interconnection 166b may be spaced apart from one another. Thus, the lower resistor 110b and the upper resistor 125b may be individually used as resistors.

In yet another embodiment, the second upper resistor interconnection 166b and the second lower resistor interconnection 165b may be electrically connected with each other. For example, as shown in FIG. 3, instead of the second upper resistor interconnection 166b and the second lower resistor interconnection 165b, a resistor connecting pattern 266 simultaneously in contact with the second upper resistor contact plug 161b and the second lower resistor contact plug 160b may be provided on the upper interlayer insulating layer 155. Thus, the lower and upper resistors 110b and 125b are not used as individual resistors, but are serially connected with each other, such that a resistor with desired resistance may be obtained. When the lower resistor 110b and the upper resistor 125a are disposed as described above, an area required for forming a resistor with desired resistance may be minimized. Accordingly, due to the reduction of the area occupied by the resistors in the present invention, the size of a semiconductor chip can be minimized. Further, the resistor formed in a single crystalline semiconductor pattern as described above has a higher sheet resistance than the same-size resistor formed in a polycrystalline silicon pattern. As a result, the present invention can provide a resistor occupying a small area and having a high resistance.

A method of fabricating a semiconductor device according to exemplary embodiments of the present invention will now be described with reference to FIGS. 1, and 2A to 2E.

Referring to FIGS. 1 and 2A, a semiconductor substrate 100 having a first circuit region C and a second circuit region P is prepared. The first circuit region C may be a memory cell array region, and the second circuit region P may be a peripheral circuit region. Meanwhile, the first circuit region C may be an active circuit region, and the second circuit region P may be a passive circuit region. The semiconductor substrate 100 may be a silicon substrate. Alternatively, the semiconductor substrate 100 may include a material such as SiC, SiGe and GaAs.

A separation layer 105s may be formed in the semiconductor substrate 100 to define a first active region 105a and a second active region 105b. The first active region 105a may be defined in the first circuit region C, and the second active region 105b may be defined in the second circuit region P. The separation layer 105s may be formed by a shallow trench isolation technique.

Impurity ions having a different conductivity from the semiconductor substrate 100 in the first circuit region C may be injected into the first active region 105a, thereby forming a word line 110a having a different conductivity type from of the semiconductor substrate 100 in the first circuit region C. Similarly, impurity ions having a different conductivity type from the semiconductor substrate 100 in the second circuit region P may be injected into the second active region 105a, thereby forming a lower resistor 110b having a different conductivity type from the semiconductor substrate 100 in the second circuit region P. For example, when the semiconductor substrate 100 in the second circuit region P has a first conductivity type and the lower resistor 110b has a second conductivity type different from the first conductivity type, the first conductivity type may be n-type, and the second conductivity type may be p-type. Alternatively, the first conductivity type may be n-type, and the second conductivity type may be p-type. The lower resistor 110b may be formed in various shapes such as bar or zigzag shapes, as seen in a plan view, to obtain desired resistance. That is, the second active region 105b where the lower resistor 110b is formed may be defined by the separation layer 105s and formed in various shapes such as bar or zigzag shapes as seen in the plan view.

Bottom surfaces of the word line 110a and the lower resistor 110b may be positioned at a higher level than that of the separation layer 105s. Sidewalls of the word line 110a and the lower resistor 110b may be surrounded by the separation layer 105s.

Meanwhile, impurity ions having a different conductivity type from of the semiconductor substrate 100 in the first circuit region C may be injected into a predetermined region of the semiconductor substrate 100 in the first circuit region C, thereby forming the word line 110a. Similarly, impurity ions having a different conductivity type from the semiconductor substrate 100 in the second circuit region P may be injected into a predetermined region in the semiconductor substrate 100 in the second circuit region P, thereby forming the lower resistor 110a, and the separation layer 105s may be formed by a shallow trench isolation technique.

The word line 110a, the lower resistor 110b and the separation layer 105s may be formed by various methods, not limited to the above-described method. For example, the word line 110a and the lower resistor 110b may be formed by an epitaxial technique. To be specific, an epitaxial semiconductor layer may be grown on the semiconductor substrate 100 and then patterned, such that a trench region may be formed to define a first epitaxial semiconductor pattern in the first circuit region C and a second epitaxial semiconductor pattern in the second circuit region P. Subsequently, the trench region may be filled with an insulating layer to form the separation layer 105s, and impurity ions having a different conductivity type from the semiconductor substrate 100 in the first circuit region C may be injected into the first epitaxial semiconductor pattern to form the word line 110a. In addition, impurity ions having a different conductivity type from the semiconductor substrate 100 in the second circuit region P may be injected into the second epitaxial semiconductor pattern to form the lower resistor 110b. Here, the first epitaxial semiconductor pattern may correspond to the first active region 105a, and the second epitaxial semiconductor pattern may correspond to the second active region 105b.

Referring to FIGS. 1 and 2B, a lower interlayer insulating layer 115 may be formed on the semiconductor substrate 100 having the word line 110a and the lower resistor 105b. The lower interlayer insulating layer 115 may be formed of silicon oxide. The lower interlayer insulating layer 115 may be patterned to form a cell diode hole 115a exposing a predetermined region of the word line 110a, and a peripheral resistance hole 115b exposing a predetermined region of the lower resistor 110b. The peripheral resistance hole 115b may be formed in various shapes such as a bar or zigzag shape, as seen in the plan view, to obtain desired resistance.

A cell semiconductor patter 117a may be formed in the cell diode hole 115a, and a peripheral semiconductor pattern 117b may be formed in the peripheral resistance hole 115b. The cell semiconductor pattern 117a may be formed by a selective epitaxial growth technique by which the word line 110a exposed through the cell diode hole 115a is employed as a seed layer, and the peripheral semiconductor pattern 117b may be formed by the selective epitaxial growth technique by which the lower resistor 110b exposed through the peripheral resistance hole 115b is employed as a seed layer. Thus, when the word line 110a and the lower resistor 110b have a single crystalline semiconductor structure, the cell and peripheral semiconductor patterns 117a and 117b may also have a single crystalline semiconductor structure.

Meanwhile, forming the cell and peripheral semiconductor patterns 117a and 117b by the selective epitaxial growth technique may include forming a semiconductor layer to fill the cell diode hole 115a and the peripheral resistance hole 115b and have a higher surface than a top surface of the lower interlayer insulating layer 115, and planarizing the semiconductor layer. As a result, the cell and peripheral semiconductor patterns 117a and 117b may be formed to have flat surfaces positioned at the same level as the top surface of the lower interlayer insulating layer 115. When the selective epitaxial growth technique is performed using a silicon source gas, the cell and peripheral semiconductor patterns 117a and 117b may be formed of single crystalline silicon.

Alternatively, the cell semiconductor pattern 117a and the peripheral semiconductor pattern 117b may be formed in the cell diode hole 115a and the peripheral resistance hole 115b, respectively, by forming a non-single crystalline semiconductor layer, i.e., an amorphous silicon layer or a polycrystalline silicon layer using a CVD technique to fill the cell diode hole 115a and the peripheral resistance hole 115b, and crystallizing the non-single crystalline semiconductor layer using a solid phase epitaxial (SPE) technique. For example, the solid phase epitaxial technique may include annealing the non-single crystalline semiconductor layer at approximately 500 to 800° C. to be crystallized into single crystalline.

Referring to FIGS. 1 and 2C, a first semiconductor pattern 120a may be formed by injecting impurity ions having a first conductivity type or a second conductivity type different from the first conductivity type into a lower region of the cell semiconductor pattern 117a. Thus, the first semiconductor pattern 120a may be formed to have the first or second conductivity type. Further, a second semiconductor pattern 125a may be formed by injecting impurity ions having the first conductivity type into an upper region of the cell semiconductor pattern 117a. Accordingly, the second semiconductor pattern 125a may be formed to have the first conductivity type. Meanwhile, the ion-injection process for forming the second semiconductor pattern 125a may be followed by the ion-injection process for forming the first semiconductor pattern 120a.

A barrier impurity region 120b may be formed by injecting impurity ions having the first conductivity type or the second conductivity type into a lower region of the peripheral semiconductor pattern 117b. Accordingly, the barrier impurity region 120b may be formed to have the first or second conductivity type. Further, an upper resistor 125b may be formed by injecting impurity ions having the first or second conductivity type into an upper region of the peripheral semiconductor pattern 117b. Accordingly, the upper resistor 125b may be formed to have the first or second conductivity type. The upper resistor 125b may be formed to have a top surface positioned at substantially the same level as that of the second semiconductor pattern 125a. Meanwhile, the ion-injection process for forming the upper resistor 125b may be followed by the ion-injection process for forming the barrier impurity region 120b. The first conductivity type may be p-type, and the second conductivity type may be n-type. Alternatively, the first conductivity type may be n-type, and the second conductivity type may be p-type.

Meanwhile, the first semiconductor pattern 120a and the barrier impurity region 120b may be formed to have the same conductivity type using the same ion-injection process. Like this, the second semiconductor pattern 120b and the upper resistor 125b may be formed to have the same conductivity type using the same ion-injection process.

The first semiconductor pattern 120a may be doped with impurities at a lower concentration than the word line 110a and the second semiconductor pattern 125a, regardless of its conductivity type. Like this, the barrier impurity region 120b may also be doped with impurities at a lower concentration than the lower resistor 110b and the upper resistor 125b, regardless of its conductivity type.

When the first semiconductor pattern 120a is doped with impurities having the second conductivity type, the first and second semiconductor patterns 120a and 125a sequentially stacked in the cell diode hole 115a constitute a cell diode D. On the other hand, when the first semiconductor pattern 120a is doped with impurities having the first conductivity type, the word line 110a and the first semiconductor pattern 120a in contact therewith constitute a cell diode.

Referring to FIGS. 1 and 2D, a middle interlayer insulating layer 130 may be formed on the lower interlayer insulating layer 115 to cover the second semiconductor pattern 125a and the upper resistor 125b. The middle interlayer insulating layer 130 may be patterned, such that a contact hole 130a exposing the second semiconductor pattern 125a may be formed. An insulating spacer 135 may be formed on a sidewall of the contact hole 130a. A lower electrode 140 filling the contact hole 130a may be formed on the substrate having the insulating spacer 135. The lower electrode 140 may be formed of metal which does not react with a phase change material layer to be formed in a following process. For example, the lower electrode 140 may be formed of a titanium nitride layer or a titanium-aluminum nitride layer.

An information storage element 145 and an upper electrode 147 may be formed on the lower electrode 140. The information storage element 145 may be formed of a phase change material layer such as a chalcogenide layer. However, the information storage element 145 is not limited to the phase change material layer. For example, the information storage element 145 may be formed of a binary metal oxide layer. The upper electrode 147 may be formed of a titanium nitride layer or a titanium-aluminum nitride layer, which do not react with the information storage element 145.

In yet another embodiment, the lower electrode 140 may partially fill the contact hole 130a. Accordingly, the information storage element 145 may be formed to have a confined shape in the contact hole 130a.

Referring to FIGS. 1 and 2E, an upper interlayer insulating layer 155 may be formed on the middle interlayer insulating layer 130 to cover the information storage element 145 and the upper electrode 147. A bit line contact plug 156 may be formed to pass through the upper interlayer insulating layer 155 and to be electrically connected with the upper electrode 147 in the first circuit region C. A bit line 157 may be formed on the upper interlayer insulating layer 155 in the first circuit region C to cover the bit line contact plug 156.

In the second circuit region P, a first lower resistor contact plug 160a and a second lower resistor contact plug 160b may be formed to sequentially pass through the upper, middle and lower interlayer insulating layers 155, 130 and 115. The first lower resistor contact plug 160a may be electrically connected with one end of the lower resistor 110b, and the second lower resistor contact plug 160b may be electrically connected with the other end of the lower resistor 110b. In the second circuit region P, a first upper resistor contact plug 161a and a second upper resistor contact plug 161b may be formed to sequentially pass through the upper and middle interlayer insulating layers 155 and 130. The first upper resistor contact plug 161a may be electrically connected with one end of the upper resistor 110a, and the second upper resistor contact plug 161b may be electrically connected with the other end of the lower resistor 110b. Meanwhile, the first and second lower resistor contact plugs 160a and 160b, and the first and second upper resistor contact plugs 161a and 161b may be formed by the same semiconductor process.

A first lower resistor interconnection 165a covering the first lower resistor contact plug 160a, a second lower resistor interconnection 165b covering the second lower resistor contact plug 160b, a first upper resistor interconnection 166a covering the first upper resistor contact plug 161a and a second upper resistor interconnection 166b covering the second upper resistor contact plug 161b may be formed on the upper interlayer insulating layer 155 in the second circuit region P. The bit line 157, the first lower resistor interconnection 165a, the second lower resistor interconnection 165b, the first upper resistor interconnection 166a and the second upper resistor interconnection 166b may be formed by the same semiconductor process. The first lower resistor interconnection 165a, the second lower resistor interconnection 165b, the first upper resistor interconnection 166a and the second upper resistor interconnection 166b may be spaced apart from one another. Thus, the lower resistor 110b and the upper resistor 125b may be individually used as resistors.

In the meantime, instead of the second upper resistor interconnection 166b and the second lower resistor interconnection 165b in FIG. 2D, a resistor connecting pattern 266 may be formed to be simultaneously in contact with the second upper resistor contact plug 161b and the second lower resistor contact plug 160b, such that the lower resistor 110b and the upper resistor 125b may be serially connected. Thus, a resistor with desired resistance may be obtained by serially connecting the lower resistor 110b with the upper resistor 125b, without using them as individual resistors.

As described above, a separate photolithography process for forming a resistor required for a semiconductor device may be omitted by forming a diode in the first circuit region C, and forming the lower resistor 110b and/or the upper resistor 125b in the second circuit region P. Thus, productivity of the semiconductor device can be improved. Further, the lower resistor 110b and the upper resistor 125b may be sequentially stacked, and thus an area occupied by the resistor in the semiconductor device may be minimized. In addition, since the lower resistor 110b and/or the upper resistor 125b may be formed of a single crystalline semiconductor material, such that a resistor may be embodied to have a higher sheet resistance than a same-size resistor having a polycrystalline structure.

According to exemplary embodiments of the present invention, a diode and a resistor may be formed. The resistor can be formed by a photolithography process of forming the diode, and thus a separate photolithography process of forming the resistor may be omitted. Further, the resistor may be formed of a single crystalline semiconductor material. Such a resistor has a higher sheet resistance than the same-size resistor formed of a polycrystalline semiconductor material. Thereby, an area occupied by the resistor can be minimized. Further, a lower resistor and an upper resistor which are sequentially stacked may be provided. Therefore, the lower resistor and the upper resistor may be individually used, or serially connected with each other, and thus desired resistance can be easily obtained. Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

That which is claimed:

1. A method of fabricating a semiconductor device, the method comprising:
    preparing a semiconductor substrate having a first circuit region and a second circuit region;
    forming a lower interlayer insulating layer on the semiconductor substrate having the first and second circuit regions;
    patterning the lower interlayer insulating layer to form a first hole passing through the lower interlayer insulating layer in the first circuit region and a second hole passing through the lower interlayer insulating layer in the second circuit region;
    forming a first semiconductor pattern and a second semiconductor pattern sequentially stacked in the first hole; and
    forming a barrier impurity region and a first resistor sequentially stacked in the second hole,
    the method further comprising:
    before forming the lower interlayer insulating layer,
    forming a separation layer in the semiconductor substrate to define a first active region in the first circuit region and a second active region in the second circuit region;
    injecting impurity ions having a different conductivity type from the semiconductor substrate in the first circuit region into the first active region to form a word line; and
    injecting impurity ions having a different conductivity type from the semiconductor substrate in the second circuit region into the second active region to form a second resistor,
    wherein the separation layer is formed to cover a sidewall of the word line and a sidewall of the second resistor, the first hole is formed to expose a predetermined region of the word line, and the second hole is formed to expose a predetermined region of the second resistor.

2. The method according to claim 1, wherein the first and second semiconductor patterns, the barrier impurity region and the first resistor have a same crystalline structure.

3. The method according to claim 1, wherein the first and second semiconductor patterns, the barrier impurity region and the first resistor have single crystalline semiconductor patterns.

4. The method according to claim 1, further comprising:
    forming an upper interlayer insulating layer over the semiconductor substrate having the first resistor and the second semiconductor pattern;
    forming a first lower resistor contact plug electrically connected with one end of the second resistor and a second lower resistor contact plug electrically connected with the other end of the second resistor, which pass through the upper and lower interlayer insulating layers in the second circuit region;
    forming a first upper resistor contact plug electrically connected with one end of the first resistor and a second upper resistor contact plug electrically connected with the other end of the first resistor, which pass through the upper interlayer insulating layer in the second circuit region;
    forming a first lower resistor interconnection covering the first lower resistor contact plug and a second lower resistor interconnection covering the second lower resistor contact plug, which are formed on the upper interlayer insulating layer in the second circuit region; and forming a first upper resistor interconnection covering the first upper resistor contact plug and a second upper resistor interconnection covering the second upper resistor contact plug, which are formed on the upper interlayer insulating layer in the second circuit region.

5. The method according to claim 1, further comprising:

forming an upper interlayer insulating layer over the semiconductor substrate having the first resistor and the second semiconductor pattern;

forming a first lower resistor contact plug electrically connected with one end of the second resistor and a second lower resistor contact plug electrically connected with the other end of the second resistor, which pass through the upper and lower interlayer insulating layers in the second circuit region;

forming a first upper resistor contact plug electrically connected with one end of the first resistor and a second upper resistor contact plug electrically connected with the other end of the first resistor, which pass through the upper interlayer insulating layer in the second circuit region;

forming a first lower resistor interconnection covering the first lower resistor contact plug and a first upper resistor interconnection covering the first upper resistor contact plug, which are formed on the upper interlayer insulating layer in the second circuit region; and forming a resistor connecting pattern in contact with the second lower resistor contact plug and the second upper resistor contact plug on the upper interlayer insulating layer in the second circuit region.

6. The method according to claim 1, wherein forming the first and second semiconductor patterns, the barrier impurity region and the first resistor comprises:

forming a cell semiconductor pattern in the first hole, and a peripheral semiconductor pattern in the second hole;

doping a lower region of the cell semiconductor pattern with impurities having a first conductivity type or a second conductivity type different from the first conductivity type using an ion injection technique;

doping an upper region of the cell semiconductor pattern with impurities having the first conductivity type using the ion injection technique;

doping a lower region of the peripheral semiconductor pattern with impurities having the first conductivity type or the second conductivity type using the ion injection technique; and doping an upper region of the peripheral semiconductor pattern with impurities having the first conductivity type or the second conductivity type using the ion injection technique.

* * * * *